US012586613B2

(12) United States Patent
Won et al.

(10) Patent No.: US 12,586,613 B2
(45) Date of Patent: Mar. 24, 2026

(54) MEMORY DEVICE INCLUDING A FILTERING CIRCUIT AND MEMORY SYSTEM INCLUDING THE MEMORY DEVICE AND FILTERING CIRCUIT

(71) Applicant: SK hynix Inc., Icheon-si (KR)

(72) Inventors: Jong Soon Won, Icheon-si (KR); Hae Rang Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 322 days.

(21) Appl. No.: 18/349,654

(22) Filed: Jul. 10, 2023

(65) Prior Publication Data

US 2024/0257844 A1    Aug. 1, 2024

(30) Foreign Application Priority Data

Jan. 30, 2023    (KR) ........................ 10-2023-0012192

(51) Int. Cl.
G11C 7/10          (2006.01)
(52) U.S. Cl.
CPC .......... G11C 7/1039 (2013.01); G11C 7/1096 (2013.01)

(58) Field of Classification Search
CPC ................................ G11C 7/1093; G11C 7/10
USPC ...................................................... 365/189.11
See application file for complete search history.

(56) References Cited

U.S. PATENT DOCUMENTS

| | | | | |
|---|---|---|---|---|
| 7,237,058 B2 * | 6/2007 | Srinivasan | ............. | G11C 15/00 |
| | | | | 711/108 |
| 8,054,099 B2 * | 11/2011 | Cabanas-Holmen | ........................ | |
| | | | | H03K 3/0375 |
| | | | | 326/12 |
| 8,335,122 B2 * | 12/2012 | Dreslinski, Jr. | ..... | G06F 12/0897 |
| | | | | 365/49.1 |
| 2004/0076194 A1 * | 4/2004 | Okamoto | ............. | H04L 65/103 |
| | | | | 348/E5.005 |
| 2013/0218901 A1 * | 8/2013 | Majnemer | ............... | G06F 3/068 |
| | | | | 707/747 |
| 2019/0266149 A1 | 8/2019 | Asaad et al. | | |

* cited by examiner

*Primary Examiner* — Muna A Techane
(74) *Attorney, Agent, or Firm* — WILLIAM PARK AND ASSOCIATES LTD.

(57)          ABSTRACT

A memory device includes a plurality of memory circuits, and a filtering circuit. The filtering circuit is configured to perform a filtering operation on data and to transmit filtered data to the plurality of memory circuits or to outside of the memory device.

18 Claims, 14 Drawing Sheets

112 — I/O PAD

114

200 — FILTERING CIRCUIT

Figure 3:
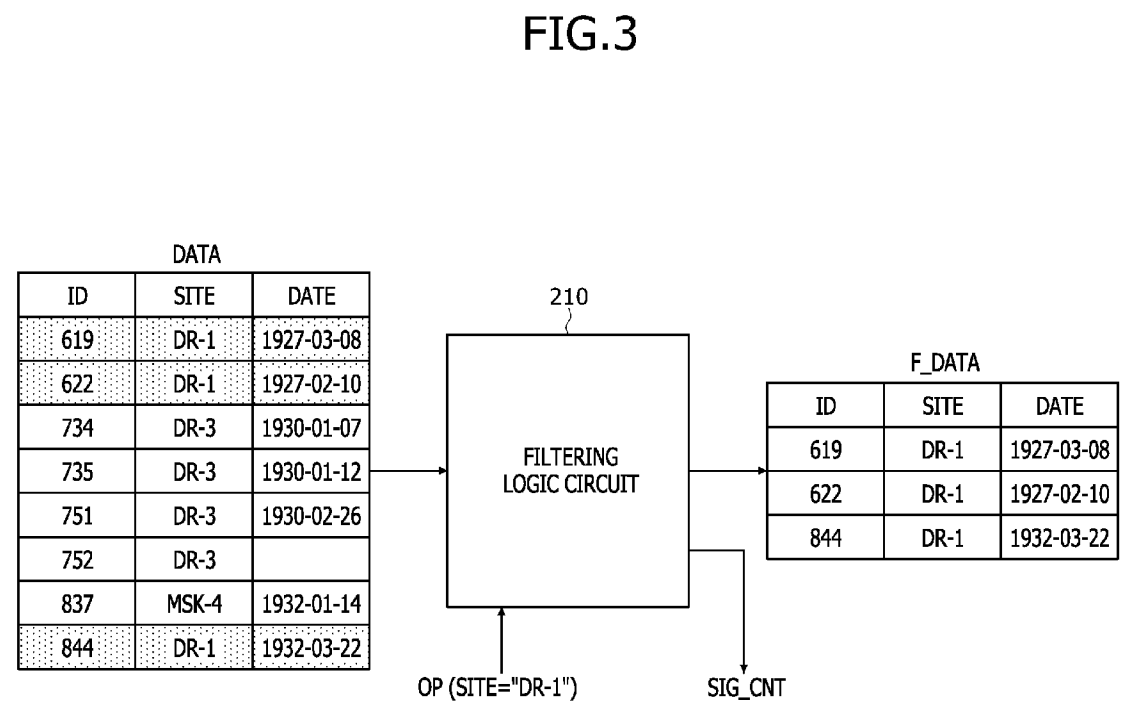

DATA

| ID | SITE | DATE |
|----|------|------|
| 619 | DR-1 | 1927-03-08 |
| 622 | DR-1 | 1927-02-10 |
| 734 | DR-3 | 1930-01-07 |
| 735 | DR-3 | 1930-01-12 |
| 751 | DR-3 | 1930-02-26 |
| 752 | DR-3 | |
| 837 | MSK-4 | 1932-01-14 |
| 844 | DR-1 | 1932-03-22 |

210

FILTERING LOGIC CIRCUIT

OP (SITE="DR-1")

SIG_CNT

F_DATA

| ID | SITE | DATE |
|----|------|------|
| 619 | DR-1 | 1927-03-08 |
| 622 | DR-1 | 1927-02-10 |
| 844 | DR-1 | 1932-03-22 |

FIG.4

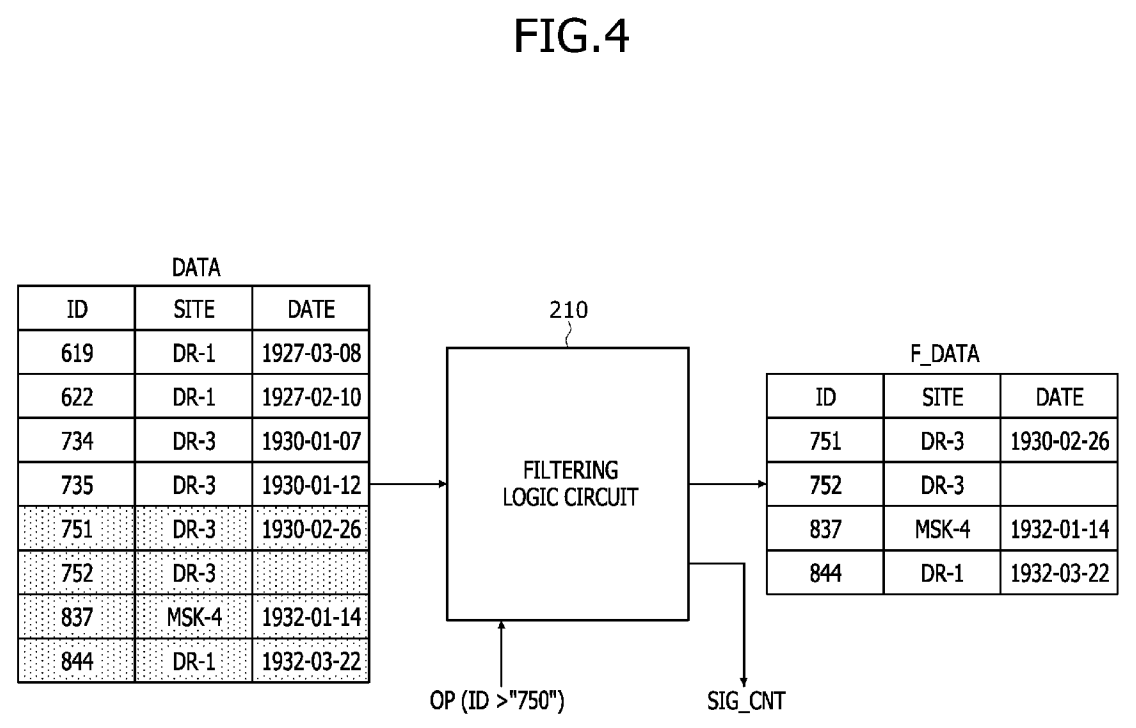

DATA

| ID | SITE | DATE |
|----|------|------|
| 619 | DR-1 | 1927-03-08 |
| 622 | DR-1 | 1927-02-10 |
| 734 | DR-3 | 1930-01-07 |
| 735 | DR-3 | 1930-01-12 |
| 751 | DR-3 | 1930-02-26 |
| 752 | DR-3 | |
| 837 | MSK-4 | 1932-01-14 |
| 844 | DR-1 | 1932-03-22 |

210

FILTERING LOGIC CIRCUIT

OP (ID >"750")

SIG_CNT

F_DATA

| ID | SITE | DATE |
|----|------|------|
| 751 | DR-3 | 1930-02-26 |
| 752 | DR-3 | |
| 837 | MSK-4 | 1932-01-14 |
| 844 | DR-1 | 1932-03-22 |

MEMORY DEVICE INCLUDING A FILTERING CIRCUIT AND MEMORY SYSTEM INCLUDING THE MEMORY DEVICE AND FILTERING CIRCUIT

CROSS-REFERENCE TO RELATED APPLICATIONS

The present application claims priority under 35 U.S.C. 119(a) to Korean Patent Application No. 10-2023-0012192, filed on Jan. 30, 2023, in the Korean Intellectual Property Office, which is incorporated herein by reference in its entirety.

BACKGROUND

1. Technical Field

Embodiments of the present disclosure generally relate to a memory device and memory system including the memory device, and more particularly, to a memory device including a filtering circuit and memory systems including the memory device and filtering circuit.

2. Related Art

Recently, with the development of internet technology, large-scale data are being generated and distributed. It is becoming a competitive edge for companies to accumulate huge amounts of data, extract meaningful information as quickly as possible, and provide extracted information to users who requested the information. For this reason, in recent years, research has been conducted on large-scale data distribution processing and work distribution parallel processing technology by constructing a large-scale cluster at low cost. In addition, as people's online connections such as multimedia, Internet of Things (IoT), and cloud computing diversify, data traffic on the internet connection network steadily increases, and computing power to process data increases. As computing power increases, it became possible to process large amounts of data, and as a result, demand for memory devices increases. However, due to the bottleneck phenomenon caused by the increase in data traffic, the performance of the entire computing system is degraded.

Typically, filtering operations on data are performed in a host device, such as a central processing unit (CPU). In this case, in order to filter the data stored in an external storage device and store the data in a memory device, first, the data is loaded from the external storage device into the memory device. Next, the data loaded into the memory device is read into a cache memory of the central processing unit. Next, the processing unit of the central processing unit performs filtering on the data read into the cache memory, and writes the filtered data in the cache memory of the central processing unit. Next, the data written in the cache memory is written in the memory device. In this manner, the data from the external storage device is filtered through the memory device and the central processing unit, and the filtered data is moved from the central processing unit to the memory device again. In general, the time required for the filtering operation in the central processing unit is shorter than a data transfer time, and thus, the bottleneck phenomenon may occur in the memory device. Moreover, the larger the size of the data, the higher the latency and power consumption.

SUMMARY

A memory device according to an embodiment of the present disclosure may include a plurality of memory circuits, and a filtering circuit. The filtering circuit may be configured to perform a filtering operation on data and to transmit filtered data to the plurality of memory circuits or to outside of the memory device.

A memory device according to an embodiment of the present disclosure may include a plurality of memory circuits, and a plurality of filtering circuits disposed to respectively correspond to the plurality of memory circuits. Each of the plurality of filtering circuits may be configured to perform a filtering operation on data and to transmit filtered data to corresponding memory circuit among the plurality of memory circuits or to the outside of the memory device.

A memory system according to an embodiment of the present disclosure may include a host device, a memory device configured to perform a read operation, a write operation, and an arithmetic operation according to a request from the host device, and an external storage device providing data to the memory device or receiving data from the memory device. The memory device may include a plurality of memory circuits, and a plurality of filtering circuits configured to receive data from the external storage device or the plurality of memory circuits and to transmit filtered data to the plurality of memory circuits or the host device.

A memory system according to an embodiment of the present disclosure may include a host device, a memory device configured to perform a read operation, a write operation, and an arithmetic operation according to a request from the host device, and an external storage device providing data to the memory device or receive data from the memory device. The memory device may include a plurality of memory circuits, and a plurality of filtering circuits disposed to respectively correspond to the plurality of memory circuits. Each of the plurality of filtering circuits may be configured to perform a data filtering operation on data and to transmit filtered data to a corresponding memory circuit among the plurality of memory circuits or an external device.

BRIEF DESCRIPTION OF THE DRAWINGS

FIG. 1 is a block diagram illustrating a memory device according to an embodiment of the present disclosure.

FIG. 2 is a block diagram illustrating a filtering circuit included in a memory device according to an embodiment of the present disclosure.

FIG. 3 is a diagram illustrating an example of a data filtering operation of a filtering logic circuit included in the filtering circuit of FIG. 2.

FIG. 4 is a diagram illustrating another example of the data filtering operation of the filtering logic circuit included in the filtering circuit of FIG. 2.

FIGS. 9 and 10 are block diagrams illustrating a filtering process for write data in the memory system of FIG. 8.

FIGS. 11 and 12 are block diagrams illustrating a filtering process for read data in the memory system of FIG. 8.

FIG. 14 is a block diagram illustrating a memory system according to still further another embodiment of the present disclosure.

DETAILED DESCRIPTION

Figure 5:
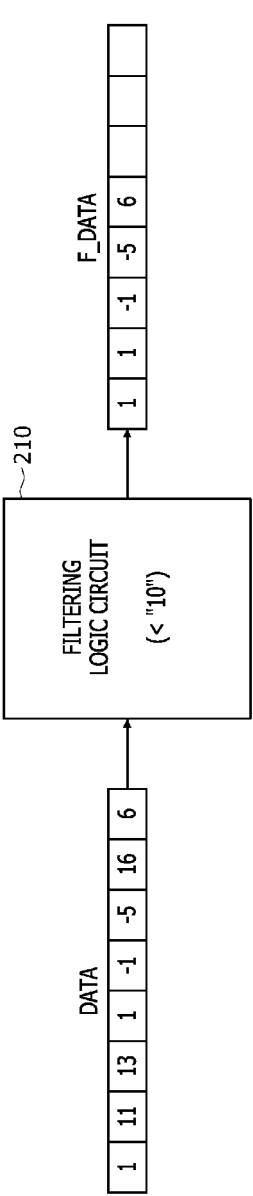
FIG. 5 is a diagram illustrating further another example of the data filtering operation of the filtering logic circuit included in the filtering circuit of FIG. 2.

In the description of the embodiments of the present disclosure, descriptions such as "first" and "second" are for distinguishing elements, and are not used to limit the members themselves or to mean a specific order. The description that one component is "connected" or "coupled" to another component may be electrically or mechanically directly connected or connected to another component. Alternatively, other separate components may be interposed in the middle to form a connection relationship. The term "predetermined" means that the value of a parameter is predetermined when using that parameter in a process or algorithm. The value of the parameter may be set when a process or algorithm starts or may be set during a period during which a process or algorithm is performed, depending on embodiments.

"Logic high level" and "logic low level" are used to describe logic levels of signals. A signal having a "logic high level" is distinguished from a signal having a "logic low level". For example, when a signal having a first voltage corresponds to a "logic high level", a signal having a second voltage may correspond to a "logic low level". According to an embodiment, the "logic high level" may be set to a higher voltage than the "logic low level". Meanwhile, the logic levels of the signals may be set to other logic levels or opposite logic levels according to embodiments. For example, a signal having a logic high level may be set to have a logic low level according to embodiments, and a signal having a logic low level may be set to have a logic high level according to embodiments.

Various embodiments of the present disclosure will be described hereinafter in more detail with reference to the accompanying drawings. Various embodiments described below take DRAM as an example as a memory device, but it is obvious that it is not limited thereto. For example, the same can be applied to static random access memory (SRAM), Synchronous DRAM (SDRAM), double data rate synchronous DRAM (DDR SDRAM, DDR2 SDRAM, DDR3 SDRAM, etc.), graphics double data rate synchronous DRAM (GDDR, GDDR2, GDDR3, etc.), quad data rate DRAM (QDR DRAM), RAMBUS XDR DRAM (XDR DRAM), fast page mode DRAM (FPM DRAM), video DRAM (VDRAM), extended data output DRAM (EDO DRAM), burst EDO DRAM (BEDO DRAM), multi-bank DRAM (MDRAM), synchronous graphic RAM (SGRAM), and/or other types of DRAM.

Figure 1:
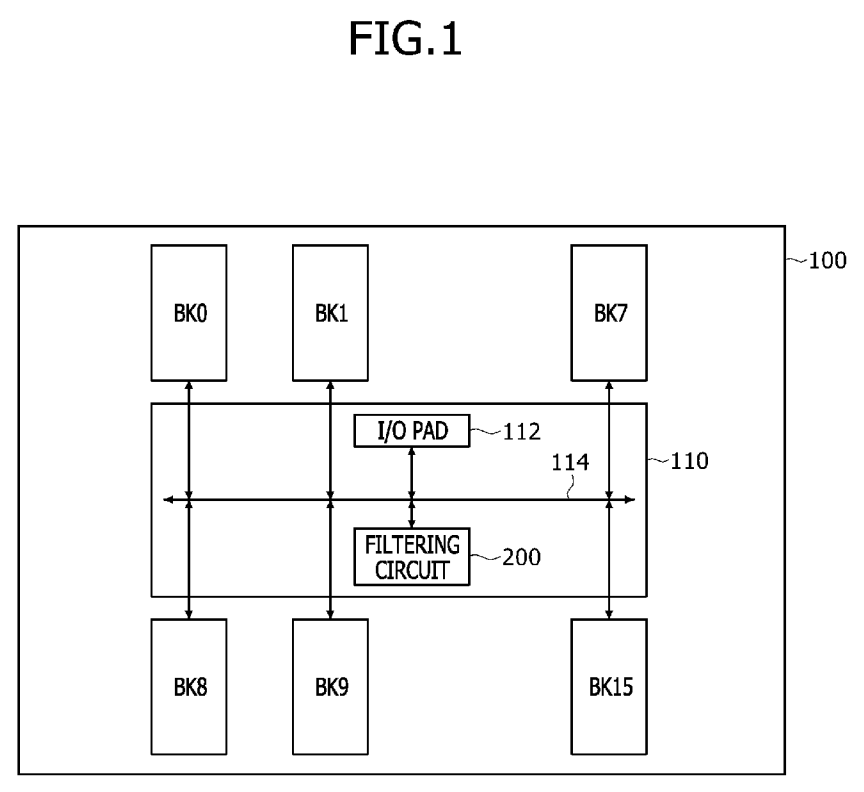

FIG. 1 is a block diagram illustrating a memory device 100 according to an embodiment of the present disclosure. Referring to FIG. 1, the memory device 100 may include a plurality of memory circuits BK1-BK15, an input/output pad (I/O pad) 112, a global input/output (GIO) line 114, and a filtering circuit 200. In an embodiment, the plurality of memory circuits BK0-BK15 may be composed of DRAM devices. The plurality of memory circuits BK0-BK15 may be composed of memory banks. In this embodiment, the memory device 100 includes sixteen memory circuits BK0-BK15, but the memory device 100 may include more or less than sixteen memory circuits. The plurality of memory circuits BK0-BK15 may perform a data read operation and a data write operation upon request from a host device, for example, a central processing unit (CPU). The plurality of memory circuits BK0-BK15 may exchange data with the input/output pad 112 and the filtering circuit 200 through the GIO line 114. Although not illustrated in FIG. 1, the memory device 100 may be a processing-in-memory (PIM) device. In this case, the memory device 100 may include a plurality of processing elements coupled to the plurality of memory circuits BK0-BK15. The plurality of processing elements may receive data from the memory circuits BK0-BK15 and perform various types of arithmetic operations.

The input/output pad 112 may perform a data input/output operation with the outside of the memory device 100. That is, the memory device 100 may receive data from an external device, for example, a host device or an external storage device, through the input/output pad 112. In addition, the memory device 100 may output data to the external device through the input/output pad 112. The input/output pad 112 may be disposed within a peripheral circuit 110 of the memory device 100. The input/output pad 112 may be coupled to the GIO line 114. When data is transmitted from the external device, the input/output pad 112 may transmit the data to the plurality of memory circuits BK0-BK15 or the filtering circuit 200 through the GIO line 114. The input/output pad 112 may receive data from the plurality of memory circuits BK0-BK15 or the filtering circuit 200 through the GIO line 114, and output the data to the external device.

The GIO line 114 may provide data transmission paths among the plurality of memory circuits BK0-BK15, the input/output pad 112, and the filtering circuit 200. That is, the GIO line 114 may provide paths through which data can be transmitted among the plurality of memory circuits BK0-BK15 and the input/output pad 112. The GIO line 114 may provide paths through which data can be transmitted among the plurality of memory circuits BK0-BK15 and the filtering circuit 200. In addition, the GIO line 114 may provide a path through which data can be transmitted between the input/output pad 112 and the filtering circuit 200.

The filtering circuit 200 may perform a filtering operation on input data, and transmit filtered data to the plurality of memory circuits BK0-BK15 or transmit the filtered data to an external device. The filtering operation performed by the filtering circuit 200 may include a conditional arithmetic operation on the input data. That is, the filtering circuit 200 may filter and output only data that meets a specific condition from the input data. In an example, the data input to the filtering circuit 200 may be numeric data, for example, data in a fixed-point format, data in a floating-point format, integer data, decimal data, and the like. However, this is just one example, and data input to the filtering circuit 200 may be various types of data other than numeric data.

The filtering circuit 200 may directly receive write data from an external storage device through the input/output pad 112 and the GIO line 114. Thus, the write data is transmitted to the filtering circuit 200 without going through memory circuits. In this case, the filtering circuit 200 may perform a filtering operation on the write data and transmit filtered write data to the plurality of memory circuits BK0-BK15 through the GIO line 114. The filtering circuit 200 may directly receive read data from the plurality of memory circuits BK0-BK15 through the GIO line 114. In this case, the filtering circuit 200 may perform a filtering operation on the read data and transmit filtered read data to an external device, such as a host device, through the GIO line 114 and the input/output pad 112.

Figure 2:
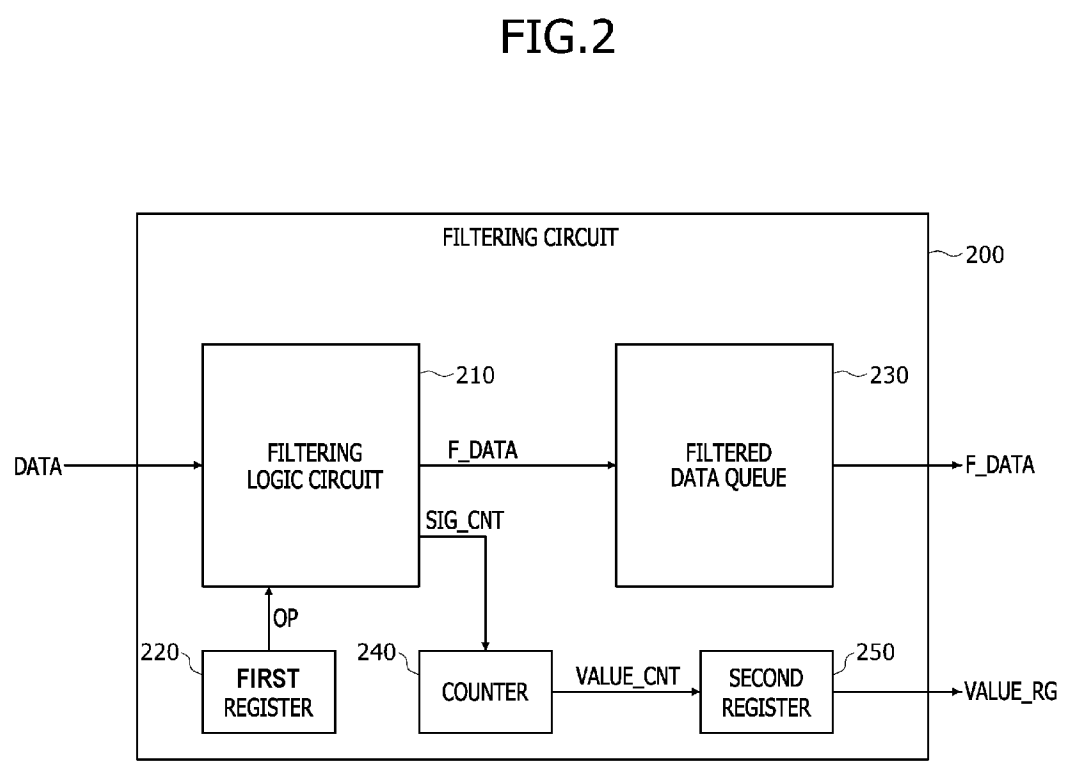

FIG. 2 is a block diagram illustrating the filtering circuit 200 included in the memory device 100 in FIG. 1. Referring to FIG. 2, the filtering circuit 200 may include a filtering logic circuit 210, a first register 220, a filtered data queue 230, a counter 240, and a second register 250.

The filtering logic circuit 210 may receive data transmitted to the filtering circuit 200. The filtering logic circuit 210 may perform a data filtering operation on the input data, and generate filtered data F_DATA and a counting signal SIG_CNT. The filtering logic circuit 210 may receive an operand OP required to perform the filtering operation from the first register 220. In an embodiment, the operand OP provided to the filtering logic circuit 210 may be a conditional operand. The filtering logic circuit 210 may transmit the filtered data F_DATA to the filtered data queue 230. The filtering logic circuit 210 may transmit the counting signal SIG_CNT to the counter 240. The filtering logic circuit 210 may output the counting signal SIG_CNT together whenever outputting the filtered data F_DATA. In an embodiment, the filtering logic circuit 210 may include a logic circuit necessary for the filtering operation, such as a logarithmic comparator or an arithmetic operator. In another embodiment, the filtering logic circuit 210 may include a logic circuit necessary for an encryption operation, such as an encryption circuit. The filtering logic circuit 210 may be configured as a programmable logic circuit.

The first register 220 may store the operand OP provided to the filtering logic circuit 210. The first register 220 may receive and store the operand OP required for a data filtering operation, before the data filtering operation is performed in the filtering logic circuit 210. For example, when the data filtering operation is an operation of comparing data with a specific value, the first register 220 may receive and store the specific value in advance. In addition, the first register 220 may provide the specific value to the filtering logic circuit 210 so that the filtering logic circuit 210 may perform an operation of comparing data with the specific value. The first register 220 may provide a plurality of operands OPs to the filtering logic circuit 210.

The filtered data queue 230 may store the filtered data F_DATA transmitted from the filtering logic circuit 210. Although not illustrated in FIG. 2, the filtered data queue 230 may output the filtered data F_DATA in response to an output control signal. In an embodiment, when the number of pieces of the stored filtered data F_DATA exceeds a certain number, the filtered data queue 230 may output the stored filtered data F_DATA. In an embodiment, the filtered data queue 230 may output the stored filtered data F_DATA in a first-in-first-out (FIFO) method.

The counter 240 may count the number of the filtered data F_DATA that is filtered by the filtering logic circuit 210. The counter 240 may perform a counting operation in response to the counting signal SIG_CNT transmitted from the filtering logic circuit 210 to generate a counting value VALUE_CNT. Because the filtering logic circuit 210 outputs the counting signal SIG_CNT whenever outputting the filtered data F_DATA, the counting value VALUE_CNT output from the counter 240 may correspond to the number of pieces of the filtered data F_DATA filtered by the filtering logic circuit 210.

The second register 250 may receive and store the counting value VALUE_CNT from the counter 240. Although not illustrated in FIG. 2, the second register 250 may receive the output control signal. The second register 250 may output the stored counting value VALUE_CNT as a register value VALUE_RG in response to the output control signal. In an embodiment, the register value VALUE_RG output from the second register 250 may be transmitted to a host device as meta data.

FIG. 3 is a diagram illustrating an example of a data filtering operation of the filtering logic circuit 210 included in the filtering circuit 200 of FIG. 2. As illustrated in FIG. 3, a case in which data DATA having eight entries for each of items of identification ID, observation site SITE, and observation date DATE is input to the filtering logic circuit 210 will be taken as an example.

Referring to FIG. 3, the filtering logic circuit 210 may receive the operand OP having an observation site SITE that has a value of "DR-1" from the first register (220 in FIG. 2). The filtering logic circuit 210 may filter out the remaining entries except for the entry satisfying a condition specified by the operand OP, that is, the entries having an observation site SITE that is "DR-1", for the entries of the data DATA. As illustrated in FIG. 3, while all observation sites SITEs of entries having identification ID of "619," "622," and "844" are "DR-1", the observation sites SITEs of the remaining entries all have values different from "DR-1". Accordingly, the filtering logic circuit 210 may output the entries having an observation site SITE is "DR-1", that is, entries with identifications IDs of "619," "622," and "844" as the filtered data F_DATA, and not output the remaining entries. The filtering logic circuit 210 may output the filtered data F_DATA, which is a result of the data filtering operation, together with the counting signal SIG_CNT and transmit the counting signal SIG_CNT to the counter (240 in FIG. 2).

FIG. 4 is a diagram illustrating another example of the data filtering operation of the filtering logic circuit 210 included in the filtering circuit 200 of FIG. 2. In this example as well, as described with reference to FIG. 3, a case in which data DATA having eight entries for each of items of identification ID, observation site SITE, and observation date DATE is input to the filtering logic circuit 210 will be taken as an example.

Referring to FIG. 4, the filtering logic circuit 210 may receive an operand OP with a condition that the identification ID is greater than "750" from the first register (220 in FIG. 2). The filtering logic circuit 210 may filter out the remaining entries except for the entries that satisfy the condition specified by the operand OP, that is, entries having identification ID that is greater than "750", for the entries of the data DATA. As exemplified in FIG. 4, while identifications IDs of the entries having identification ID that is "751," "752," "837," and "844" are all greater than "750", the identifications IDs of the remaining entries are all smaller than "750". Accordingly, the filtering logic circuit 210 may output the entries having the identification ID greater than "750", that is, the entries having the identification ID of "751," "752," "837," and "844" as the filtered data F_DATA, and not output the remaining entries. The filtering logic circuit 210 may output the filtered data F_DATA, which is a result of the data filtering operation, together with the counting signal SIG_CNT, and transmit the counting signal SIG_CNT to the counter (240 in FIG. 2).

FIG. 5 is a diagram illustrating further another example of the data filtering operation of the filtering logic circuit 210 included in the filtering circuit 200 of FIG. 2. Referring to FIG. 5, a case where data DATA in which values of "1," "11," "13," "1," "–1," "–5," "16," and "6" are sequentially arranged is input to the filtering logic circuit 210, and a conditional operand OP having a condition of less than "10" is set in the filtering logic circuit 210 will be taken as an example. In this case, the filtering logic circuit 210 may output only values less than "10", that is, values of "1," "1,"

"–1," "–5," and "6" as the filtered data F_DATA among the values of "1," "11," "13," "1," "–1," "–5," "16," and "6" included in the data DATA. In this example, the size of the filtered data F_DATA output from the filtering logic circuit 210 may be smaller than the size of the data DATA input to the filtering logic circuit 210.

Figure 6:
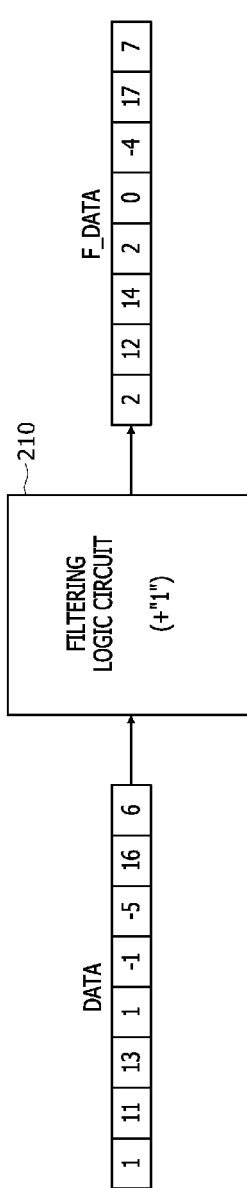
FIG. 6 is a diagram illustrating further another example of the data filtering operation of the filtering logic circuit included in the filtering circuit of FIG. 2.

FIG. 6 is a diagram illustrating further another example of the data filtering operation of the filtering logic circuit 210 included in the filtering circuit 200 of FIG. 2. Referring to FIG. 6, a case where the data DATA in which values of "1," "11," "13," "1," "–1," "–5," "16," and "6" are sequentially arranged is input to the filtering logic circuit 210 and a conditional operand OP having a condition of adding "1", that is, +"1" is set in the filtering logic circuit 210 will be taken as an example. In this case, the filtering logic circuit 210 may add "1" to the values of "1," "11," "13," "1," "–1," "–5," "16," and "6" included in the data DATA to output the filtered data F_DATA having values of "2," "12," "14," "2," "0," "–4," "17," and "7". In this example, the size of the data DATA input to the filtering logic circuit 210 and the size of the filtered data F_DATA output from the filtering logic circuit 210 may be the same.

Figure 7:
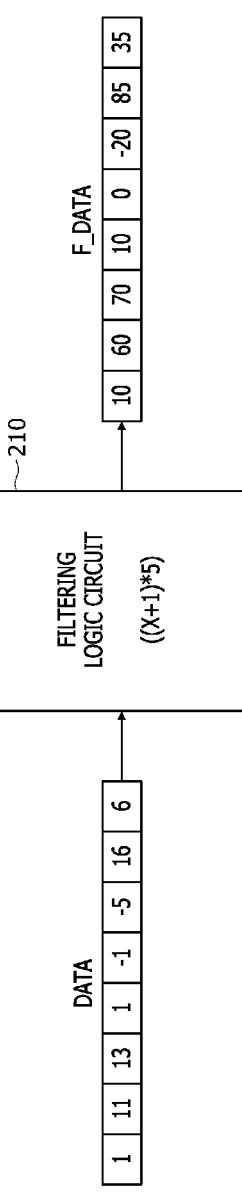
FIG. 7 is a diagram illustrating further another example of the data filtering operation of the filtering logic circuit included in the filtering circuit of FIG. 2.

FIG. 7 is a diagram illustrating further another example of the data filtering operation of the filtering logic circuit 210 included in the filtering circuit 200 of FIG. 2. Referring to FIG. 7, a case in which data DATA in which values of "1," "11," "13," "1," "–1," "–5," "16," and "6" are sequentially arranged is input to the filtering logic circuit 210 and a conditional operand OP having a condition of multiplying by "5" after adding "1", that is, "(X+1)*5" is set in the filtering logic circuit 210 will be taken as an example. Here, "X" may represent the value of input data DATA. In this case, the filtering logic circuit 210 may add "1" to each of the values of "1," "11," "13," "1," "–1," "–5," "16," and "6" included in the data DATA and multiply by "5" to output the filtered data F_DATA having values of "10," "60," "70," "10," "0," "–20," "85," and "35". Even in this example, the size of the data DATA input to the filtering logic circuit 210 and the size of the filtered data F_DATA output from the filtering logic circuit 210 may be the same.

Figure 8:
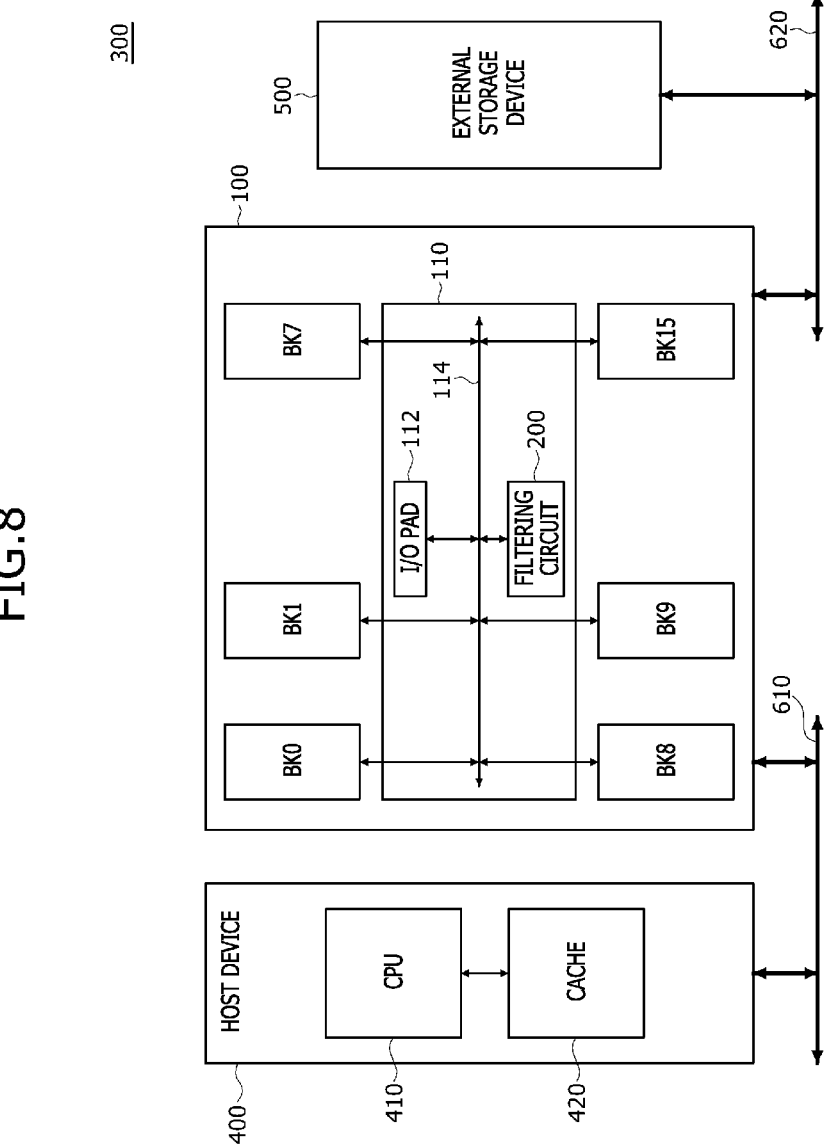
FIG. 8 is a block diagram illustrating a memory system according to an embodiment of the present disclosure.

FIG. 8 is a block diagram illustrating a memory system 300 according to an embodiment of the present disclosure. Referring to FIG. 8, the memory system 300 may include a memory device 100, a host device 400, and an external storage device 500. A configuration of the memory device 100 may be the same as that described with reference to FIGS. 1 to 8. That is, the memory device 100 may include a plurality of memory circuits BK0-BK15 and a filtering circuit 200.

The memory device 100 and the host device 400 may exchange data with each other through a first data bus 610. The memory device 100 and the external storage device 500 may exchange data with each other through a second data bus 620. The host device 400 may include a central processing unit (CPU) 410 and a cache memory 420. The CPU 410 may transmit data to the cache memory 420 or receive data from the cache memory 420. The cache memory 420 may communicate with the first data bus 610. Accordingly, the cache memory 420 may transmit data to the memory device 100 or receive data from the memory device 100 through the first data bus 610. In an embodiment, the external storage device 500 may be a hard disk drive (HDD) or a solid-state drive (SSD). In another embodiment, the external storage device 500 may be a network storage device. The external storage device 500 may transmit data to the memory device 100 or receive data from the memory device 100 through the second data bus 620. In the memory system 300 according to the present embodiment, the memory device 100 may perform a read operation, a write operation, and an arithmetic operation according to a request from the host device 400. In addition, the external storage device 500 may provide stored data to the memory device 100 or receive and store data from the memory device 100.

Figure 9:
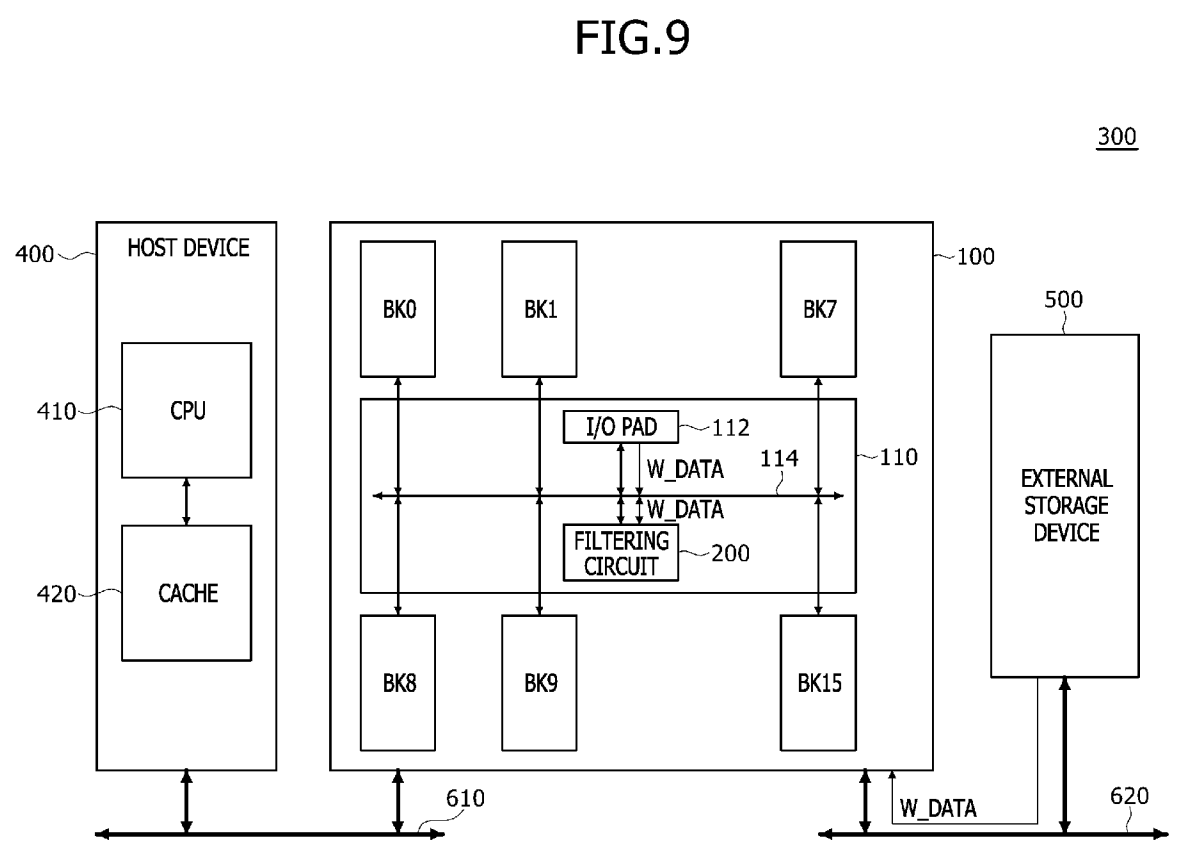
Figure 10:
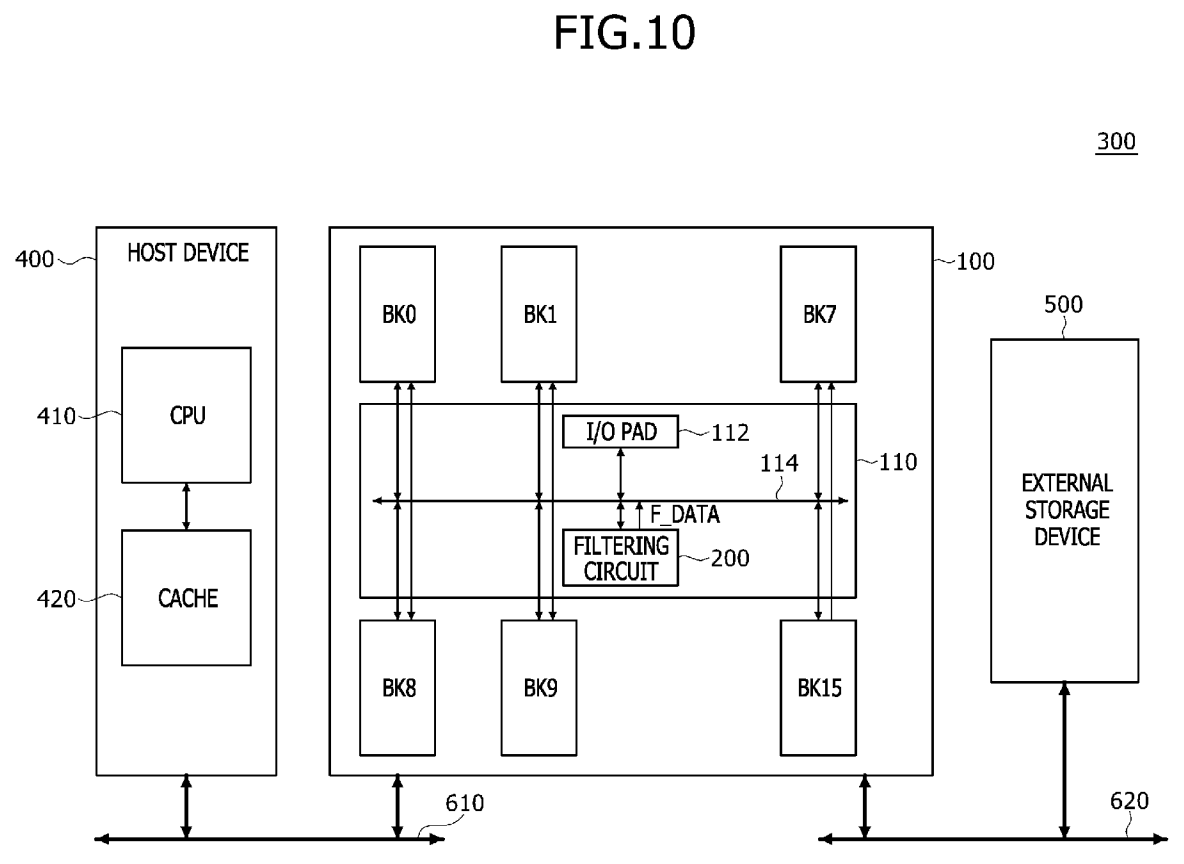

FIGS. 9 and 10 are block diagrams illustrating a filtering process for write data in the memory system 300 of FIG. 8. In FIGS. 9 and 10, the same reference numerals as those in FIG. 8 denote the same components, and duplicate descriptions will be omitted.

First, as illustrated in FIG. 9, the external storage device 500 may transmit write data W_DATA to the memory device 100 through the second data bus 620 at the request of the host device 400. An input/output pad 112 of the memory device 100 may transmit the write data W_DATA transmitted from the external storage device 500 to the filtering circuit 200 through a GIO line 114. Next, as illustrated in FIG. 10, the filtering circuit 200 may perform a filtering operation on the write data W_DATA to generate filtered data F_DATA. Next, the filtering circuit 200 may transmit the filtered data F_DATA to the first to sixteenth memory circuits BK0-BK15 through the GIO line 114. As such, when a filtering operation on the write data is performed in the memory system 300 according to the present embodiment, the write data W_DATA from the external storage device 500 may be directly filtered and written within the memory device 100 without passing through the host device 400.

Figure 11:
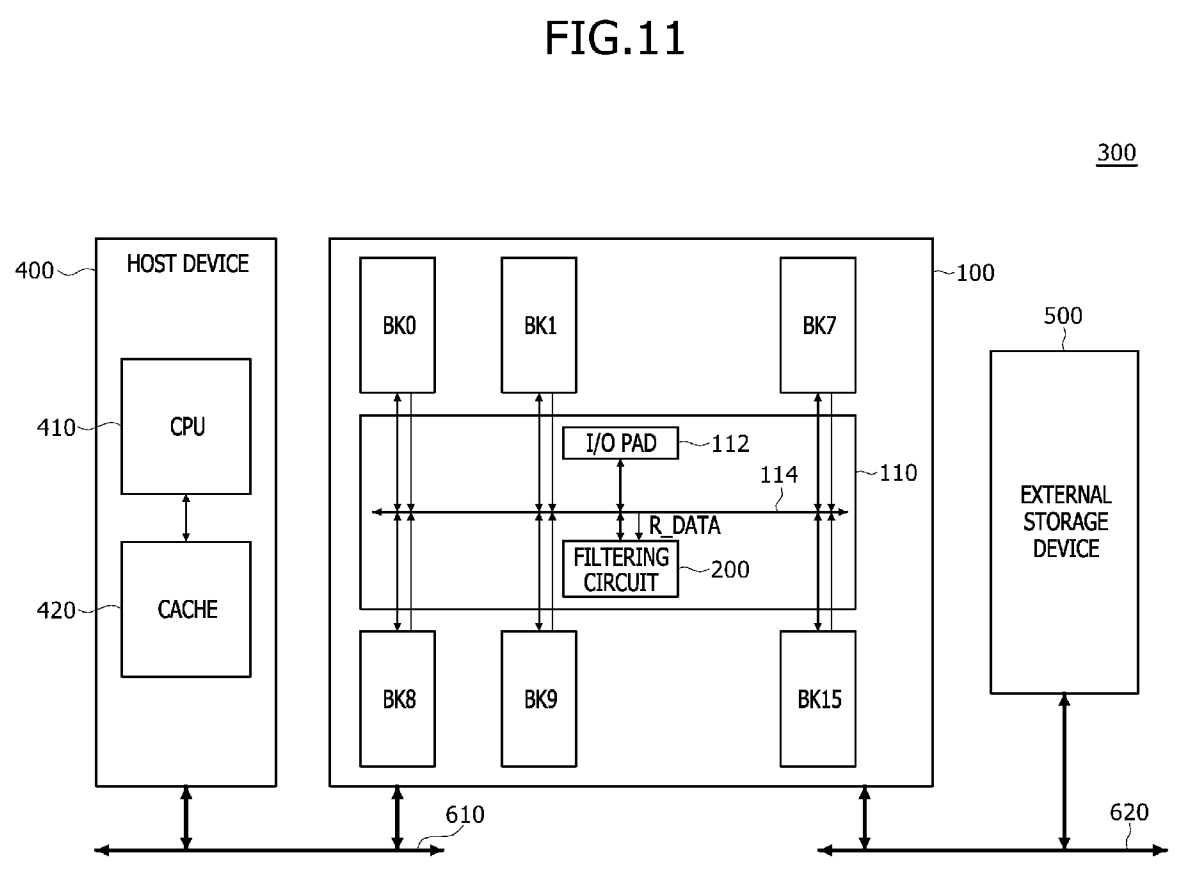
Figure 12:
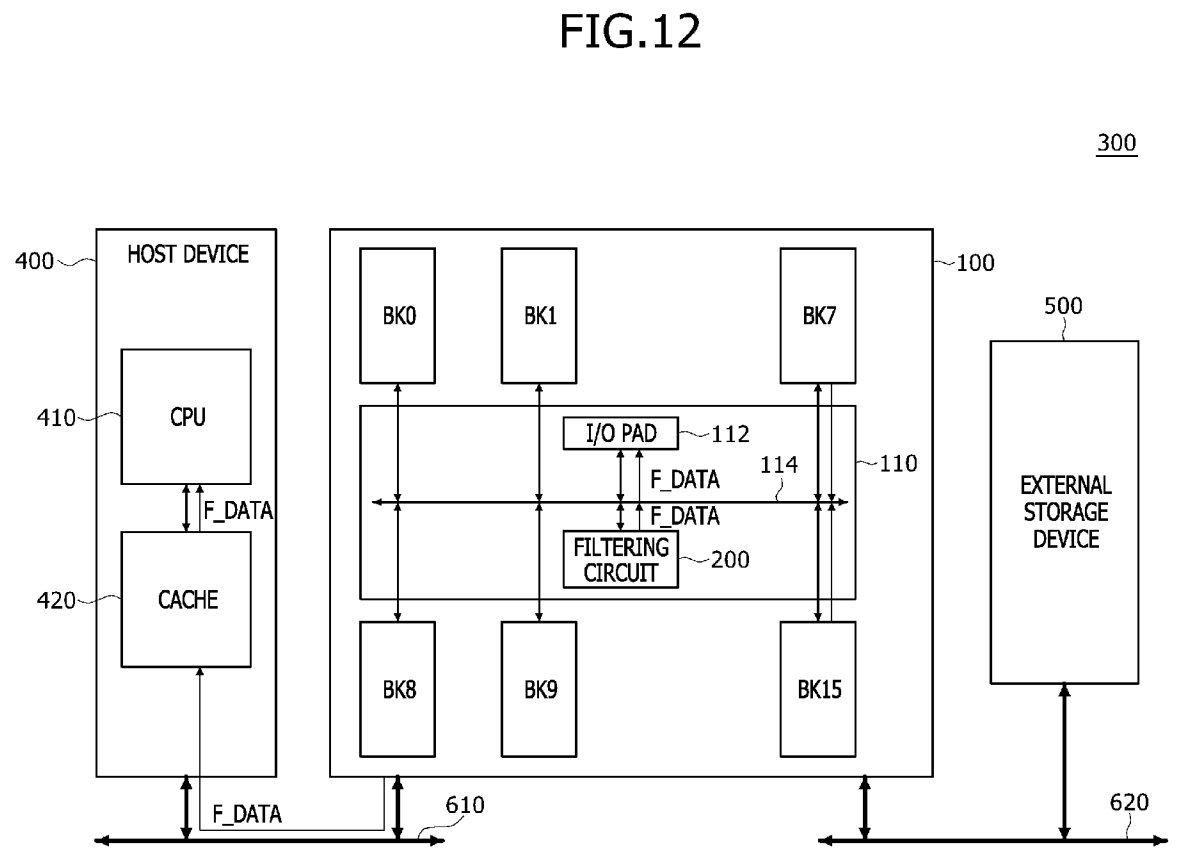

FIGS. 11 and 12 are block diagrams illustrating a filtering process for read data in the memory system 300 of FIG. 8. In FIGS. 11 and 12, the same reference numerals as those in FIG. 8 denote the same components, and duplicate descriptions will be omitted.

First, as illustrated in FIG. 11, at the request of the host device 400, the first to sixteenth memory circuits BK0-BK15 of the memory device 100 may transmit read data R_DATA to the filtering circuit 200 of the memory device 100 through the GIO line 114. Next, as illustrated in FIG. 12, the filtering circuit 200 may perform a filtering operation on the read data (R_DATA in FIG. 11) to generate filtered data F_DATA. Next, the filtering circuit 200 may transmit the filtered data F_DATA to the first data bus 610 through the GIO line 114 and the input/output pad 112. The filtered data F_DATA transmitted from the memory device 100 to the first data bus 610 may be transmitted to the cache memory 420 of the host device 400. The filtered data F_DATA transmitted to the cache memory 420 may be transmitted to the CPU 410.

Figure 13:
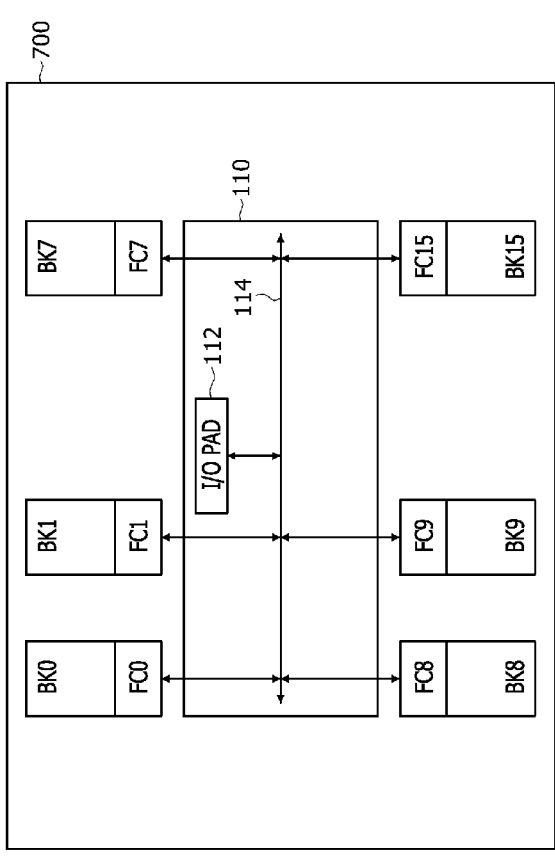
FIG. 13 is a block diagram illustrating a memory device according to another embodiment of the present disclosure.

FIG. 13 is a block diagram illustrating a memory device 700 according to another embodiment of the present disclosure. In FIG. 13, the same reference numerals as those in FIG. 1 denote the same components, and duplicate descriptions will be omitted below. Referring to FIG. 13, the memory device 700 may include a plurality of, for example, first to sixteenth memory circuits BK0-BK15, and a plurality of, for example, first to sixteenth filtering circuits FC0-FC15. Each of the first to sixteenth filtering circuits FC0-FC15 may be configured identically to the filtering circuit 200 described with reference to FIGS. 1 to 7. In an example, the first to sixteenth filtering circuits FC0-FC15 may perform the same filtering operation. In another example, the first to sixteenth filtering circuits FC0-FC15 may perform different filtering operations. The first to sixteenth filtering circuits FC0-FC15 may be disposed to correspond to the first to sixteenth memory circuits BK0-BK15, respectively. That is, one of the first to sixteenth filtering circuits FC0-FC15 and a corresponding one of the first to sixteenth memory circuits BK0-BK15 may constitute one memory-filtering circuit pair. As illustrated in FIG. 13, the first filtering circuit FC0 and the first memory circuit BK0 may constitute a first memory-filtering circuit pair. The second filtering circuit FC1 and the second memory circuit BK1 may constitute a second memory-filtering circuit pair. Similarly, the sixteenth filtering circuit FC15 and the sixteenth memory circuit BK15 may constitute a sixteenth memory-filtering circuit pair.

The first to sixteenth filtering circuits FC0-FC15 may receive write data transmitted from an external device of the memory device 700, for example, an external storage device to an input/output pad 112 through a GIO line 114. In this case, the first to sixteenth filtering circuits FC0-FC15 may perform a data filtering operation on the write data to generate filtered write data. The first to sixteenth filtering circuits FC0-FC15 may transmit the filtered write data to the first to sixteenth memory circuits BK0-BK15.

The first to sixteenth filtering circuits FC0-FC15 may receive read data from the first to sixteenth memory circuits BK0-BK15. In this case, the first to sixteenth filtering circuits FC0-FC15 may perform a data filtering operation on the read data to generate filtered read data. The first to sixteenth filtering circuits FC0-FC15 may transmit the filtered read data to the external device of the memory device 700, for example, a host device through the GIO line 114 and the input/output pad 112.

Figure 14:
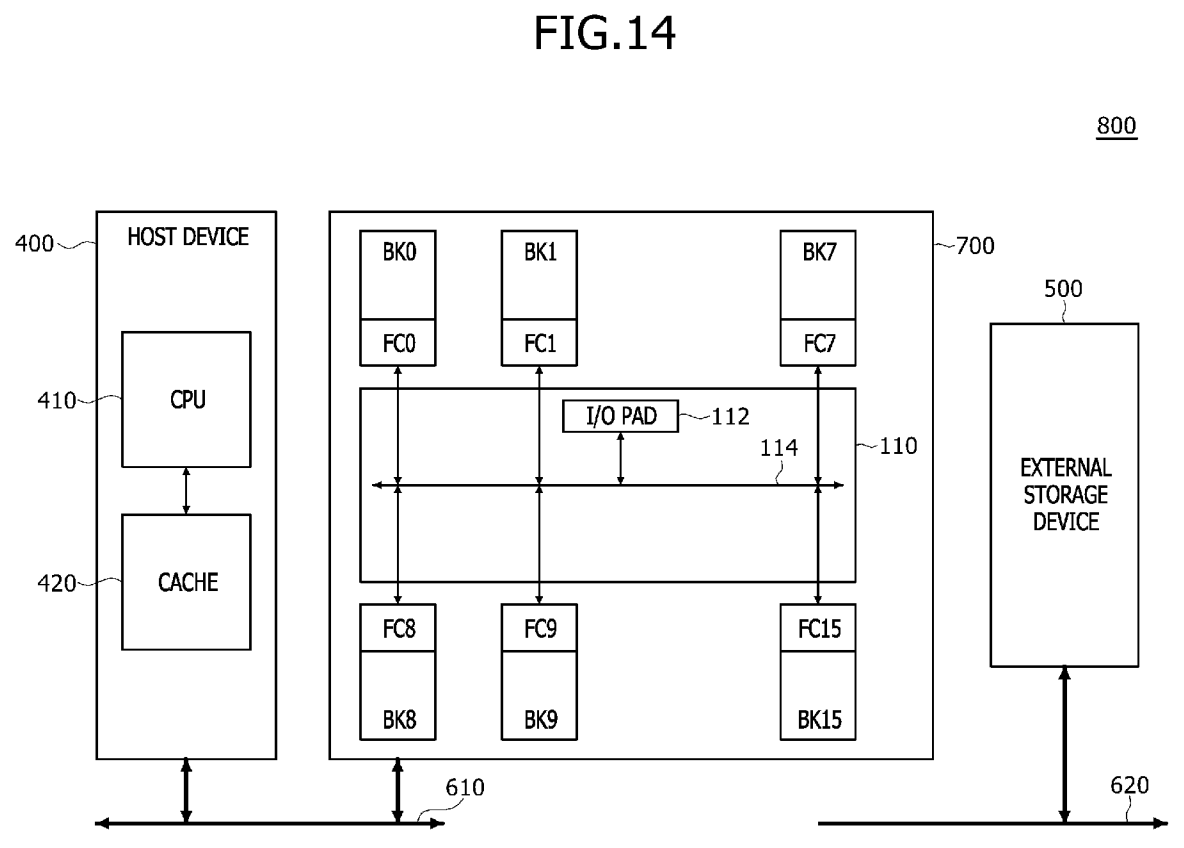

FIG. 14 is a block diagram illustrating a memory system 800 according to another embodiment of the present disclosure. Referring to FIG. 14, the memory system 800 may include a memory device 700, a host device 400, and an external storage device 500. A configuration of the memory device 700 may be the same as that described with reference to FIG. 13. That is, the memory device 700 may include a plurality of memory circuits BK0-BK15 and a plurality of filtering circuits FC0-FC15.

Configurations of the host device 400 and the external storage device 500 may be the same as those described with reference to FIG. 8. That is, the memory device 100 and the host device 400 may exchange data with each other through a first data bus 610. The memory device 100 and the external storage device 500 may exchange data with each other through a second data bus 620. The host device 400 may include a central processing unit (CPU) 410 and a cache memory 420. The external storage device 500 may transmit data to the memory device 100 or receive data from the memory device 100 through the second data bus 620. In the memory system 800 according to the present embodiment, the memory device 700 may perform a read operation, a write operation, and an arithmetic operation according to a request from the host device 400. In addition, the external storage device 500 may provide stored data to the memory device 700 or receive and store data from the memory device 700.

In order to filter write data from the external storage device 500 to write the write data in the memory circuits BK0-BK15 of the memory device 700, first, the external storage device 500 may transmit the write data to the input/output pad 112 of the memory device 700 through the second data bus 620. The write data transmitted to the input/output pad 112 may be transmitted to first to sixteenth filtering circuits FC0-FC15 through the input/output pad 112 and the GIO line 114 of the memory device 700. In this case, the write data may be distributed and transmitted to the first to sixteenth filtering circuits FC0-FC15 or may be transmitted in common. The first to sixteenth filtering circuits FC0-FC15 may perform a data filtering operation on the received write data to generate filtered write data. The first to sixteenth filtering circuits FC0-FC15 may perform the same type of data filtering operation on the received write data, or may perform different types of data filtering operations on the received write data. The first to sixteenth filtering circuits FC0-FC15 may transmit the filtered write data to first to sixteenth memory circuits BK0-BK15.

In order to filter and read the read data stored in the first to sixteenth memory circuits BK0-BK15 of the memory device 700, first, the first to sixteenth memory circuits BK0-BK15 may transmit the read data to the first to sixteenth filtering circuits FC0-FC15. The first to sixteenth filtering circuits FC0-FC15 may perform a data filtering operation on the received read data to generate filtered read data. The first to sixteenth filtering circuits FC0-FC15 may transmit the filtered read data to the first data bus 610 through the GIO line 114 and the input/output pad 112. In addition, the filtered read data may be transmitted to the host device 400 through the first data bus 610.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A memory device comprising:
   a plurality of memory circuits;
   a filtering circuit configured to perform a filtering operation on data and to transmit filtered data to the plurality of memory circuits or to outside of the memory device; and
   an input and output (input/output) pad performing a data input/output operation with the outside of the memory device,
   wherein the filtering circuit is configured to directly receive write data from the outside of the memory device through the input/output pad to perform a data filtering operation and to transmit filtered write data to the plurality of memory circuits.

2. The memory device of claim 1, wherein each of the plurality of memory circuits comprise a memory bank.

3. The memory device of claim 1,
   further includes a global input/output line providing data transmission paths between the plurality of memory circuits, the filtering circuit, and the input/output pad.

4. The memory device of claim 3, wherein the filtering circuit is configured to receive the write data from the outside of the memory device through the input/output pad and to write the filtered write data in the plurality of memory circuits through the global input/output line.

5. The memory device of claim 3, wherein the filtering circuit is configured to receive read data from the plurality of memory circuits to perform a data filtering operation and to transmit filtered read data to the outside of the memory device.

6. The memory device of claim 5, wherein the filtering circuit is configured to receive the read data from the plurality of memory circuits through the global input/output line and to output the filtered read data to the outside of the memory device through the global input/output line and the input/output pad.

7. The memory device of claim 1, wherein the filtering circuit is configured to perform a filtering operation in which a size of the data input to the filtering circuit and a size of the filtered data output from the filtering circuit are different from each other.

8. The memory device of claim 1, wherein the filtering circuit is configured to perform a filtering operation in which a size of the data input to the filtering circuit and a size of the filtered data output from the filtering circuit are the same as each other.

9. The memory device of claim 1, wherein the filtering circuit includes:

a filtering logic circuit configured to perform the data filtering operation;

a first register configured to provide a conditional operand to the filtering logic circuit; and a filtered data queue configured to store the data filtered by the filtering logic circuit and to output the filtered data.

10. The memory device of claim 9, wherein the filtering circuit further includes:

a counter configured to count the number of the data filtered by the filtering logic circuit; and a second register configured to store a value counted by the counter.

11. A memory device comprising:

a plurality of memory circuits;

a plurality of filtering circuits disposed to respectively correspond to the plurality of memory circuits; and an input and output (input/output) pad performing a data input/output operation with the outside of the memory device, wherein each of the plurality of filtering circuits is configured to perform a filtering operation on data and to transmit filtered data to corresponding memory circuit among the plurality of memory circuits or to the outside of the memory device, and configured to directly receive write data from the outside of the memory device through the input/output pad to perform a data filtering operation and to transmit filtered write data to the plurality of memory circuits.

12. A memory system comprising:

a host device;

a memory device configured to perform a read operation, a write operation, and an arithmetic operation according to a request from the host device; and an external storage device providing data to the memory device or receiving data from the memory device, wherein the memory device includes:

a plurality of memory circuits;

a plurality of filtering circuits configured to receive data from the external storage device or the plurality of memory circuits and to transmit filtered data to the plurality of memory circuits or the host device; and an input and output (input/output) pad performing a data input/output operation with the host device and the external storage device, wherein each of the filtering circuits is configured to receive write data from an external storage device through the input/output pad to perform a data filtering operation, and to write filtered write data in the plurality of memory circuits through the global input/output line.

13. The memory system of claim 12, wherein the host device and the external storage device perform data communication with the memory device through a first data bus and a second data bus, respectively.

14. The memory system of claim 12, wherein the memory device further includes:

a global input/output line providing data transmission paths between the plurality of memory circuits, the filtering circuit, and the input/output pad.

15. The memory system of claim 14, wherein the filtering circuit is configured to receive read data from the plurality of memory circuits through the global input/output line to perform a data filtering operation, and to output filtered read data to a host device through the global input/output line and the input/output pad.

16. The memory system of claim 12, wherein the filtering circuit is configured to perform a filtering operation in which a size of the data input to the filtering circuit and a size of the filtered data output from the filtering circuit are different from each other, and wherein the filtering circuit is configured to perform a filtering operation in which a size of the data input to the filtering circuit and a size of the filtered data output from the filtering circuit are the same as each other.

17. The memory system of claim 12, wherein the filtering circuit includes:

a filtering logic circuit configured to perform a data filtering operation;

a first register configured to provide a conditional operand to the filtering logic circuit;

a filtered data queue configured to store the data filtered by the filtering logic circuit and output the filtered data;

a counter configured to count the number of the data filtered by the filtering logic circuit; and a second register configured to store a value counted by the counter.

18. A memory system comprising:

a host device;

a memory device configured to perform a read operation, a write operation, and an arithmetic operation according to a request from the host device; and an external storage device providing data to the memory device or receiving data from the memory device, wherein the memory device includes:

a plurality of memory circuits;

a plurality of filtering circuits disposed to respectively correspond to the plurality of memory circuits; and an input and output (input/output) pad performing a data input/output operation with the host device and the external storage device, and wherein each of the plurality of filtering circuits is configured to perform a data filtering operation on data and to transmit filtered data to a corresponding memory circuit among the plurality of memory circuits or an external device, and configured to receive write data from an external storage device through the input/output pad to perform a data filtering operation, and to write filtered write data in the plurality of memory circuits through the global input/output line.

* * * * *